United States Patent [19]
Chu et al.

[11] Patent Number: 5,498,642
[45] Date of Patent: Mar. 12, 1996

[54] RADIATION SURFACE-CURABLE, ROOM TEMPERATURE VULCANIZING SILICONE COMPOSITIONS

[75] Inventors: Hsien-Kun Chu, Wethersfield; Robert P. Cross, Simsbury, both of Conn.

[73] Assignee: Loctite Corporation, Hartford, Conn.

[21] Appl. No.: 276,019

[22] Filed: Jul. 15, 1994

Related U.S. Application Data

[60] Continuation-in-part of Ser. No. 218,452, Mar. 25, 1994, abandoned, which is a division of Ser. No. 14,143, Feb. 19, 1993, Pat. No. 5,300,608, which is a continuation-in-part of Ser. No. 861,143, Mar. 31, 1992, abandoned.

[51] Int. Cl.⁶ ............................................. C08F 2/46
[52] U.S. Cl. .................... 522/99; 528/12; 528/17; 528/18; 528/32; 522/40; 522/44; 522/46
[58] Field of Search ................ 528/12, 32; 522/99, 522/40, 44, 46

[56] References Cited

U.S. PATENT DOCUMENTS 4,158,617  6/1979  Eldred ............................. 204/159.13
4,528,081  7/1985  Lien et al. ....................... 204/159.13

*Primary Examiner*—John C. Bleutge
*Assistant Examiner*—Margaret W. Glass
*Attorney, Agent, or Firm*—Steven J. Hultquist

[57] ABSTRACT

A radiation surface-curable RTV silicone composition which subsequent to radiation surface curing thereof, is interiorly moisture-curable in character. Such radiation surface-curable, interiorly moisture-curable RTV silicone composition comprises: a silanol-containing silicone; a silane cross-linker for the silicone, such cross-linker having joined directly to a silicon atom thereof an ethylenically unsaturated functional group and at least two hydrolyzable functional groups; and a photoinitiator effective for radiation surface curing of the silicone composition. Also disclosed is a "liquid potting system" formulation, which is irradiated subsequent to dispensing thereof at the potting locus, so that the radiation surface-cured skin layer overlies and contains (cooperatively with the associated bounding surface(s) of the potting locus) the uncured liquid, so that the potted structure or material is encapsulated in a liquid (damping) medium.

13 Claims, 2 Drawing Sheets

RADIATION SURFACE-CURABLE, ROOM TEMPERATURE VULCANIZING SILICONE COMPOSITIONS

This is a Continuation-in-Part of application Ser. No. 08/218,452, filed Mar. 25, 1994, now abandoned, which was a divisional of application Ser. No. 08/014,143, filed Feb. 19, 1993, now U.S. Pat. No. 5,300,608, which in turn is a continuation-in-part of application Ser. No. 07/861,143, filed Mar. 31, 1992, now abandoned.

BACKGROUND OF THE INVENTION

1. Field of the Invention

The present invention relates to radiation surface-curable room temperature vulcanizing (RTV) silicone compositions, and to a method of making and using same.

2. Description of the Related Art

RTV silicone materials are widely used in industry as well as in consumer markets as sealants, adhesives, coating, potting compounds, etc. Typically, these materials are manufactured by endcapping, α,ω-silanol terminated silicones with various crosslinkers such as alkoxysilanes, oximinosilanes, acetoxysilanes, aminosilanes, and other silanes with hydrolyzable groups attached to the silicon atom(s) thereof.

The resulting RTV silicone materials are stored in moisture impermeable containers. During application, the materials are extruded or otherwise applied and exposed to ambient conditions for curing. The moisture in the air then will hydrolyze the hydrolyzable groups (alkoxy, oximino, acetoxy, amino, etc.) on the silicon atom(s), to form silanol, either with or without the assistance of an added catalyst.

The resulting silanol can then further react with remaining unhydrolyzed groups in a condensation reaction, to form a siloxane linkage resulting in the cure of the silicone material.

The above-discussed reactions are illustrated below:

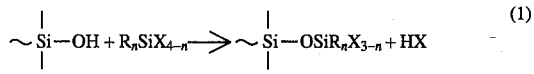  (1)

where R=alkyl, aryl etc., X=OR, oximino, acetoxy, amino, amido etc., and n=0–2.

Depending on the X group, the above reaction may or may not require the assistance of a catalyst.

  (2)

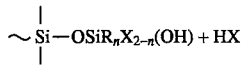

Again, depending on X group, catalyst(s) may or may not be present.

  (3)

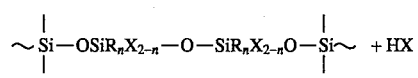

Although the RTV materials are very reliable and possess superior properties in the aforementioned end use applications (sealants, adhesives, coatings, potting compounds, etc.), the RTV materials often are very slow to cure. For example, a typical RTV silicone formulation often requires overnight curing before acceptable cure properties for the intended end use applications can be fully realized.

As a result, there exists a need to "fix," i.e., spatially immobilize, the applied RTV quickly, so that the applied material will not migrate from the locus of intended use, before a full cure of the RTV silicone is achieved. Such migration may be extremely deleterious. For example, if a sealant RTV formulation is applied to a joint to effect waterproof sealing thereof, migration such as sag or running of the sealant can take place (in the absence of adequate curing of the formulation). The migrated sealant formulation as a result may no longer overlie the joint to be sealed, so that the appertaining jointed structure may be rendered deficient or even useless for its intended purpose.

U.S. Pat. No. 4,526,955 to Bennington et al. describes radiation-polymerizable compositions including organopolysiloxanes having —N—Si or N—O—Si linkages.

Japanese Patent Application No. 4-69901 filed Feb. 12, 1992 by Three-Bond Co., Ltd. discloses an ultraviolet-curing, addition-polymerization-type silicone composition which is curable at room temperature. The disclosed silicone composition comprises a polydiorganosiloxane containing vinyl groups and a polydiorganosilane in which at least 4 silicon atoms are directly bonded in the formula $R_5(Si(R_3)(R_4))_nR_6$ in which $R_3$–$R_6$ are alkyl or aryl, and n is 4 or greater, with the proviso that $R_5$ and $R_6$ may be directly bonded to one another. An addition polymerization catalyst is also included in the composition, such as a platinum catalyst. The composition is uv-light curable with the occurrence of radical addition polymerization.

Hoffman, V., et al., *J. Mol. Struct.*, 293, 253–256 (1993) describes oligomers including a vinyl group-containing dimethylsiloxane which are thermally as well as photochemically crosslinkable.

Roth, W., et al., *Adv. Mater.*, 2(10), 497–498 (1990) discloses a methylvinyl-dimethylsiloxane composition that is devoid of photoinitiators, and undergoes radical crosslinking when exposed to laser radiation.

Barrall, E., et al., *J. Polym. Sci., Polym. Symp.*, 71, 189–202 (1984) describes uv-cured polydimethylsiloxanes containing pendant vinyl groups, wherein the curing involves dicumyl peroxide-mediated vulcanization.

U.S. Pat. No. 4,064,027 to Gant describes a uv-curable composition consisting essentially of a vinyl-containing siloxane and siloxane-containing, silicon-bonded hydrogen atoms, in which a mercaptofunctional silicone may be employed as a cure accelerator.

U.S. Pat. No. 4,742,092 to Inoue et al. and U.S. Pat. No. 4,595,471 to Preiner et al. show UV and dual UV/moisture curable silocones which employ photocurable (meth)acryloxy and isopropenyloxy group containing silicones in combination with mercapto-containing silicones.

Ep 0492828 discloses UV curable silicones of alkoxy terminated polydiorganosiloxanes in combination with an alkoxy silicone compound which is capable of photo reactivity. This patent, however, teaches compositions wherein the silanol terminated diorganopolysiloxane is first reacted with solely hydrolyzable groups containing endcappers. As a result, the silicones are not terminated with UV activatable groups.

Accordingly, it would be a substantial advance in the art, and is correspondingly an object of the present invention, to provide an RTV silicone composition which is rapidly "settable" at the application locus following application of the formulation to such locus, so that migration effects (sag, non-bonding, loss of joint seal integrity, exposure of components intended to be encapsulated, etc.) are minimized or eliminated, but is curable in a conventional manner under ambient atmosphere exposure conditions to moisture cure and achieve superior fully cured properties.

Another object of the present invention is to provide an improved RTV silicone composition of such character, which is readily formulated in a convenient manner using conventionally available resin and formulation components.

Other objects and advantages of the invention will be more fully apparent from the ensuing disclosure and appended claims.

SUMMARY OF THE INVENTION

The present invention generally relates to radiation surface-curable RTV silicone compositions.

In one broad aspect, the invention comprises a radiation surface-curable RTV silicone composition which subsequent to radiation surface curing thereof, is interiorly (beneath the radiation-cured surface or "skin" of the composition) moisture-curable in character. Such radiation surface-curable, subsequently interiorly moisture-curable RTV silicone composition may suitably comprise:

an ethylenically unsaturated functional group endcapped silicone wherein said endcapped silicone is formed by reacting a silanol-terminated silicone with a non-mercapto-group containing silane cross-linker for the silicone, such cross-linker having joined directly to a silicon atom thereof an ethylenically unsaturated functional group and at least 2 hydrolyzable groups and said endcapped silicone has a number average molecular weight of at least about 5000 and preferably at least about 10,000 as determined by nuclear magnetic resonance; and a photoinitiator for effecting radiation surface curing of the silicone composition.

The silanol-terminated silicone preferably is predominantly linear in character, having the silanol (—SiOH) functionality located at the terminus of a polysiloxy (—(SiO)$_x$—) moiety in the silicone molecule.

The non-mercapto group containing silane cross-linker in the above-described composition may advantageously have the formula $$R_a SiX_b$$

wherein:

R is selected from the group consisting of monovalent ethylenically unsaturated radicals, hydrogen, $C_1$–$C_8$ alkyl, $C_6$–$C_{12}$ aryl, $C_7$–$C_{18}$ arylalkyl, $C_7$–$C_{18}$ alkylaryl, and X;

X is a monovalent functionality imparting moisture-curability to the reaction product of the silanol-functionalized silicone and silane cross-linker;

a has a value of 1 or 2;

b has a value of 2 or 3; and a+b=4 with the proviso that when a is 1, R is a monovalent ethylenically unsaturated radical, and that when a is 2, at least one R is a monovalent ethylenically unsaturated radical.

The monovalent ethylenically unsaturated radical may for example be selected from the group consisting of vinyl, propenyl, butenyl, pentenyl, hexenyl, octenyl, allyl, alkenyloxy, alkenylamino, allyloxy, allylamino, furanyl, phenyl, and benzyl groups. Specific illustrative species of the non-mercapto group containing crosslinker include vinyltrimethoxysilane, vinyltriaminosilane, vinyltriamidosilane, vinyltrioximinosilane, and vinyltriacetoxysilane.

In another aspect, the invention relates to a potting material for dispensing to an encapsulation locus including a bounding surface delimiting a volume in which an encapsulation structure is disposable for potting in a liquid medium overlaid by an enclosure layer adhesively bonded to the bounding surface, such potting material comprising:

an ethylenically unsaturated functional group endcapped silicone having no hydrolyzable groups and said endcapped silicon has a number average molecular weight of at least about 5000 as determined by nuclear magnetic resonance; and a photoinitiator effective for radiation surface curing of the silicone composition wherein the potting material is surface-curable by irradiation of the material to form said overlying enclosure layer and wherein subsequent to formation thereof the potting material underlying the enclosure layer is non-hydrolyzable.

In yet another broad aspect, the present invention relates to a potted element structural article, comprising:

means defining an encapsulation locus including a bounding surface delimiting an encapsulation volume;

an element disposed in the encapsulation volume;

a potting medium encapsulating the element in the encapsulation volume, said potting medium comprising a silicone liquid medium overlaid by a solid silicone film enclosingly and adhesively bonded to the bounding surface, so that the element is potted in the silicone liquid medium, and the silicone liquid medium is contained in the encapsulation volume by the solid silicone film.

The potting medium in such potted element structural article suitably comprises a surface-radiation-cured potting composition formed by surface-radiation-curing of a silicone composition comprising:

a vinyl-functional silicone devoid of hydrolyzable groups; and a photoinitiator effective for radiation surface curing of the silicone composition wherein the potting material is surface-curable by irradiation of the material to form said overlying enclosure layer and wherein subsequent to formation thereof the potting material underlying the enclosure layer is non-moisture-curable.

In yet another aspect, the present invention relates to a method of potting an element in a structural encapsulation locus including a bounding wall surface, such method comprising:

disposing said element in the encapsulation locus;

dispensing into the encapsulation locus a silicone potting composition comprising: an ethylenically unsaturated functional group endcapped silicone wherein said endcapped silicone is formed by reacting a silanol-terminated silicone with a non-mercapto-group containing silane cross-linker for the silicone, such cross-linker having joined directly to a silicon atom thereof an ethylenically unsaturated functional group and at least 2 hydrolyzable groups and said endcapped silicon has a number average molecular weight of at least about 5000 as determined by nuclear magnetic resonance; and a photoinitiator effective for radiation surface curing of the silicone composition; and irradiating the silicone potting composition in the encapsulation locus, to surface-cure same and form a solid silicone layer enclosingly and adhesively bonded to the bounding surface, and overlying non-radiation-cured potting composition.

In the above-described method, when the vinyl-terminated silicone has no hydrolyzable groups the non-radiation-cured potting composition may be uncurable by moisture exposer, with the non-radiation-cured potting composition being maintained in uncured condition, so that the element in the encapsulation locus is potted in the non-radiation-cured potting composition.

Alternatively, the non-radiation-cured potting composition subsequent to the irradiating step may be moisture-curable, and the appertaining manufacturing process may further comprise moisture-curing the non-radiation-cured potting composition.

Other aspects and features of the invention will be more fully apparent from the ensuing disclosure and appended claims.

DETAILED DESCRIPTION OF THE INVENTION, AND PREFERRED EMBODIMENTS THEREOF

Figure 1:
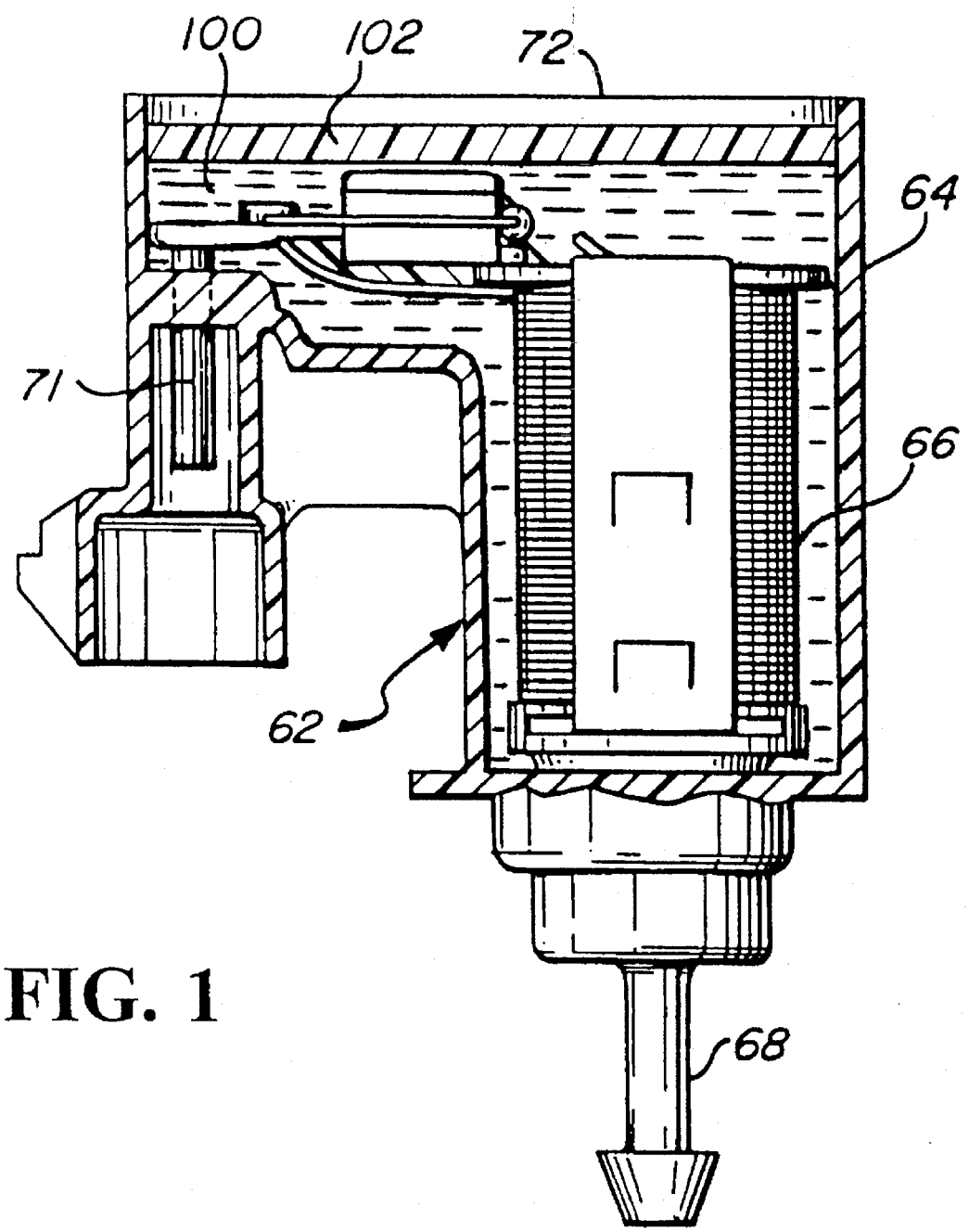
FIG. 1 is a partially sectioned side view of an electronic fuel flow sensor assembly, potted with a silicone composition according to one embodiment of the present invention.

The silicone compositions utilize silane crosslinkers containing olefinically unsaturated group(s) attached to the silicon atom of the crosslinker. Such crosslinker upon reacting with the silanol-terminated silicone (as shown in equation (1) hereinabove) allows formulations of RTV silicones.

However, the present inventors also unexpectedly discovered that the materials thus prepared, upon formulation with common photoinitiators such as diethoxyacetophenone, can undergo light (actinic radiation exposure) cure to form a firm, non-tacky surface "skin" that possesses structural integrity, i.e., is hard and non-migratory in character, and protects the uncured RTV silicone composition underneath but that does not prevent the moisture cure of the RTV formulation.

Thus, ethylenically-unsaturated silane capping species, such as vinyltrimethoxysilane, vinyltrioximinosilane and vinyltriacetoxysilane, were used to endcap silanol-terminated fluids, to form vinyl-functional products, such as vinyldimethoxy-, vinyldioximinoxy- and vinyldiacetoxy-terminated fluids, respectively. Such fluids upon the addition of photoinitiators were found to undergo surface uv cure to form strong, non-tacky films. When exposed to suitable actinic radiation of curingly effective character, the resulting radiation-cured surface film is typically sufficiently strong to protect and support the uncured liquid underneath the film even when the substrate element bearing the radiation-cured silicone layer is inverted in relation to its initial radiation exposure position.

The inventors also discovered that ambient temperature (typically, from about 0° C. to about 30° C.) atmospheric moisture (normal relative humidity (RH), e.g., from about 2% to 100% RH) exposure conditions can, subsequent to the aforementioned light-induced "skin cure" of the composition, be utilized to effect moisture-curing of the RTV silicone material beneath the radiation-cured skin layer, and surprisingly, the initial surface radiation-cured film formation did not change the hardness of the RTV silicone after such final moisture cure.

Thus, silicone formulations of the present invention can be sequentially polymodally cured, by initial actinic radiation, e.g., uv cure, and subsequent moisture cure, and such silicone formulations are also curable in toto by moisture cure only. In either event (polymodal curing involving sequential initial radiation surface curing followed by bulk interior volume moisture-curing, or unimodal curing involving only moisture curing of the entire silicone formulation), the physical properties of the respective cured materials are substantially the same.

The present invention, as a result of its susceptibility to being surface-cured by radiation impingement as well as (or alternatively) by RTV moisture curing, thereby permits great flexibility in use, particularly in instances where the geometric or positional character of the substrate(s) to which the composition is applied would otherwise cause deleterious sagging or migration of the silicone composition before it is able to be moisture-cured via RTV crosslinking. In such instances, the applied silicone composition of the invention can be selectively surface cured by radiation exposure, in those regions latently susceptible to sag or migration or alternatively over the entire surface of the applied compositional mass, and then the slow moisture cure can be allowed to take place under normal atmospheric moisture exposure conditions.

Alternatively, in instances where the applied silicone material is not susceptible to sag or migration phenomena, the material can be fully and solely cured by moisture exposure under normal ambient temperature relative humidity conditions. The composition of the present invention is curable at ambient temperature conditions, without any net addition or application of heat to such silicone composition.

The invention can be very useful in many applications. For example, in potting compound applications, after extruding a silicone potting material according to the present invention into the cavity or interior volume of the structure in which component(s) or other material(s) are to be potted for encapsulation thereof, the applied potting material can be subjected to a quick light irradiation to form a fixed and firm low to non-tacky film of sufficient strength to structurally enclose the uncured RTV silicone composition underneath the surface-curing skin. The resulting potted structural article can then be readily transported, while allowing slow moisture cure to take place during transport and storage of the article. In this manner, the potting operation can be quickly concluded in the manufacturing facility so that the potted articles are immediately ready for transport and packaging, thereby avoiding the substantial inventory of uncured potted articles which in prior practice has had to be substantially moisture-cured prior to such transport and packaging.

The present invention can be also useful in forming non-tacky coatings which are not inhibited by the presence of oxygen, as is commonly the case with uv cure involving (meth)acrylate functional groups. As used herein, the term "non-tacky" in reference to the surface of a silicone compositional mass subjected to radiation exposure, means that such surface is deformable, but touch-resilient or non-adherent to, and non-deformed by, the touch, i.e., contact of a human finger with such surface.

The present invention also contemplates the provision of a dual cure silicone composition comprising a uv cure/ moisture cure dielectric gel, in applications where ultraviolet radiation used to effect the uv cure is not accessible to the entire surface of the applied dielectric gel mass, so that the exterior of the mass includes radiation-accessible (direct impingement) regions as well as shadow regions that are blocked to radiation impingement (e.g., by housing or potted component structures in potting applications; by mask or other material layer elements in conformal coating applications; etc.).

In such "shadow cure" applications of dielectric gels or other silicone compositions of the present invention, both the direct impingement radiation cured/moisture cured regions of the compositional mass, as well as the shadow regions where only moisture-cure took place, would exhibit similar physical properties (e.g., hardness, toughness, thermal resistance, tensile strength, fracture resistance, temperature stability, compressive strength, etc.) in the final cured material.

The surface-photocurable silicone compositions may be surface-cured by exposure to any radiation conditions that are surface-curingly-effective for the composition. Suitable radiant energy types that may be usefully employed in the broad practice of the invention include electron beam radiation, ultraviolet radiation, visible light radiation, gamma radiation, X-rays, b-rays, etc. Preferably, the surface-photocuring radiation is actinic radiation, i.e., electromagnetic radiation having a wavelength of about 700 nm or less that is capable of effecting surface cure of the silicone composition. Most preferably, the surface-photocuring radiation comprises ultraviolet (uv) radiation.

It will be recognized that the type and character of the surface-photocuring radiation that is used to form a cured skin or film on the silicone compositional mass of the present invention after its application to the substrate or other locus of use, may be widely varied within the broad scope of the present invention, and that the surface-curing radiation exposure cure times are correspondingly variable, with respect to and depending on such factors as: the particular silicone formulation employed, type and light-responsiveness of the specific photoinitiator employed, the wavelength and flux of the radiation, the concentration of the photoinitiator in the composition, and the thickness of the coating or other form of the applied compositional mass.

Generally, the radiation exposure time is relatively short, that is, less than about 3 minutes. Exposing the composition to excessive amounts of radiation may "overcure" the composition, resulting in poor physical and performance properties. The amount of radiation that is excessive varies with the given formulation of the silicone composition, coating thickness, radiation source, etc., and may readily be determined by the skilled artisan without undue experimentation.

Correspondingly, the thickness of the radiation-cured skin that is efficacious to provide the required structural stability and containment of the underlying uncured (e.g., liquid or flowable (semi)solid) silicone composition is readily determinable within the skill of the art by routine and simple experimentation.

For example, the depth of cure required in a given end use application may be empirically established by exposure of corresponding amounts of the composition on separate substrate samples to varying amounts of radiation (or other varying parameters, e.g., amounts in the respective compositional samples of photoinitiator; or amounts of filler; or distances between the applied compositional mass and the radiation source; etc.), followed by translation, inversion, etc. of the samples to determine which composition samples sag or migrate.

The silanol-terminated silicone utilized in the composition of the present invention may suitably comprise a linear polydiorganosiloxane, or other linear silicone, having a weight average molecular weight which may for example range from about 5,000 to about 300,000, preferably from about 10,000 to about 80,000, and most preferably from about 10,000 to about 50,000.

Although such silicone is preferably linear in conformation, other, non-linear silicones, e.g., branched, cyclic or macromeric, may be usefully employed in the broad practice of the present invention. Preferably, the silicone (polysiloxane) is predominantly linear in character. The silanol (—SiOH) functionality is located at the terminus of a polysiloxy (—(SiO)$_x$—) moiety in the silicone molecule, e.g., the hydroxy functionality is covalently bonded to a terminal silicon atom of the polysiloxy backbone, in the case of a linear silicone, or to a terminal silicon atom of a main or side chain or other aggregation of siloxy repeating units in the case of a branched or otherwise nonlinear silicone molecular conformation.

Preferably, the polysiloxane is a linear molecule both of whose terminal functional groups comprise hydroxy groups. Thus, for example, the polysiloxane material may comprise a hydroxy-terminated polydimethylsiloxane, or a hydroxy-terminated polydiphenylsiloxane. Preferably, the silicone is an organopolysiloxane whose organo substituents are predominantly methyl.

A particularly preferred polysiloxane material which has been usefully employed in the practice of the present invention is a hydroxy-terminated polydimethylsiloxane of linear configuration, having a weight average molecular weight as determined by gel-permeation chromatography on the order of 10,000 to 50,000.

The non-mercapto group containing silane cross-linker employed in the compositions of the invention for cross-linking of the silanol-terminated silicone, comprises a silane compound having joined directly to a silicon atom thereof an ethylenically unsaturated functional group and at least two hydrolyzable functional groups.

The silane cross-linker may for example have the formula

wherein:

R is selected from the group consisting of monovalent ethylenically unsaturated radicals, hydrogen, $C_1$–$C_8$ alkyl, $C_6$–$C_{12}$ aryl, $C_7$–$C_{18}$ arylalkyl, $C_7$–$C_{18}$ alkylaryl, and X;

X is a monovalent functionality imparting moisture-curability to the reaction product of the silanol-terminated silicone and non-mercapto group containing silane cross-linker;

a has a value of 1 or 2;

b has a value of 2 or 3; and a+b=4 with the proviso that when a is 1, R is a monovalent ethylenically unsaturated radical, and that when a is 2, at least one R is a monovalent ethylenically unsaturated radical.

In such cross-linker formula, the monovalent ethylenically unsaturated radical may for example contain from 2 to 12 carbon atoms. Illustrative monovalent ethylenically unsaturated radicals suitable for the cross-linker include vinyl, propenyl, butenyl, pentenyl, hexenyl, octenyl, allyl, alkenyloxy, alkenylamino, allyloxy, allylamino, furanyl, phenyl and benzyl groups. Preferably, the monovalent ethylenically unsaturated radical is selected from the group consisting of vinyl and allyl groups, and most preferably, the monovalent ethylenically unsaturated radical is vinyl.

Illustrative non-mercapto group containing silane cross-linker species which may be utilized in practicing the present invention include vinyltrimethoxysilane, vinyltriaminosilane, vinyltriamidosilane, vinyltrioximinosilane, and vinyltriacetoxysilane.

As used herein, the term "vinyl" refers to the group $CH_2=CH-$.

The non-mercapto group containing silane cross-linker may be used at any suitable concentration in the silicone composition of the present invention which is cross-linkingly effective for the silicone, as may be stoichiometrically determined in a straightforward manner within the skill of the art, or as may be readily empirically determined within the skill of the art by varying the concentration of the cross-linker relative to the silanol-terminated silicone in the silicone composition, and cross-linking the composition in the presence of moisture, with and/or without initial surface-radiation-curing of the composition.

By way of example, in the case of compositions of the present invention utilizing silane cross-linker species such as vinyltrimethoxysilane, vinyltriaminosilane, vinyltriamidosilane, vinyltrioximinosilane, and vinyltriacetoxysilane, the cross-linker concentration is generally on the order of from about 1% to 10% by weight, based on the weight of the silanol-terminated silicone, and more preferably from about 1.5% to 5% by weight, on the same silanol-terminated silicone weight basis.

In contrast to the silicone compositions disclosed in Bennington U.S. Pat. No. 4,526,955, which describes the use of an organosilicon compound having an average of at least two and preferably three or four groups per molecule having Si—N and/or Si—O—N linkages, the crosslinker silanes utilized in the present invention comprise compounds having an ethylenically unsaturated functional group directly bonded to a silicon atom of the silane and at least two hydrolyzable functional groups joined directly to a silicon atom of the silane, with such silane, and the resulting silicone (polysiloxane) product formed by reaction of the crosslinker and the silanol-functionalized silicone, having Si—C and/or Si—O—C bonded moieties.

The photoinitiator employed in silicone compositions of the present invention may suitably comprise a photoinitiator that may include any photoinitiator known in the art that is useful to effect photopolymerization of ethylenically unsaturated (e.g., vinyl or allyl) compounds in the presence of curingly effective radiation.

Potentially useful photoinitiators may include, by way of example, benzoin, substituted benzoins such as benzoin ethyl ether, benzophenone, benzophenone derivatives, Michler's ketone, dialkoxyacetophenones such diethoxyacetophenone, acetophenone, benzil, and other derivatives (substituted forms) and mixtures thereof. A particularly preferred photoinitiator material is diethoxyacetophenone. Although any suitable effective amount of photoinitiator may be employed in the surface photocurable silicone compositions of the invention, generally the photoinitiator concentration will be usefully employed in the range of about 0.1% to about 10% by weight, and more specifically and preferably from about 0.2% to about 5% by weight, based on the weight of the hydroxy-functional silicone.

The photoinitiator employed in the photocurable silicone compositions of the present invention may also be polymer bound. Such photoinitiators are described in U.S. Pat. Nos. 4,477,326 and 4,587,276. Other free radical initiators, such as peroxy thermal initiators may be used in some of the lower molecular weight silicone formulations of the invention.

The compositions of the present invention may also include other ingredients to modify the cured or uncured properties of the composition, as necessary or desirable for a specific and use application.

In instances where the non-mercapto group containing silane cross-linker species used in the present invention is vinyltrimethoxysilane, a curing catalyst may be necessary. Examples of curing catalysts include, but are not limited to tin, titanium, aluminum, zirconium and any other suitable curing catalyst known in the art.

Fillers or reinforcing materials may usefully be employed in compositions of the present invention to provide enhanced mechanical properties, and in some instances enhanced uv radiation surface curability of the composition.

Among preferred fillers are reinforcing silicas. The reinforcing silicas are fumed silicas which may be untreated (hydrophilic) or treated to render them hydrophobic in character.

In general, fillers may be employed at any suitable concentration in the curable silicone composition, but generally are present at concentrations of from about 5 to about 45% by weight, based on the weight of the polysiloxane. Generally, any other suitable mineralic, carbonaceous, glass or ceramic fillers may potentially advantageously be employed. Examples include gourd quartz, tabular alumina, diatomaceous earth, silica balloons, calcium carbonate, carbon black, titanium oxide, aluminum oxide, aluminum hydroxide, zinc oxide, glass fibers, etc.

In addition, the silicone compositions of the present invention may also optionally contain an adhesion promotor, to enhance the adhesive character of the composition for a specific substrate (e.g., metal, glass, ceramic, etc.), when the composition is employed as an adhesive for bonding of respective substrate elements or members.

Any suitable adhesion promotor constituents may be employed for such purpose, depending on the specific substrate elements or members employed in a given application. For example, the adhesion promotor might be selected to enhance the adhesion of the composition on substrates comprising materials such as metals, glasses, ceramics, plastics, and mixtures, blends, composites, and combinations thereof.

Various organosilane compounds may be usefully employed for such purpose, and such compounds may also feature oxirane functionality, as well as silicon-bonded alkoxy substituents, to provide broad adhesive bonding utility. In such organosilane compounds, the oxirane functionality may be provided by a glycidoxyalkyl substituent on a silicon atom of the silane compound. A particularly preferred adhesion promotor of such type is glycidoxypropyltrimethoxysilane.

In addition, further additives such as MQ or MDQ resins can be incorporated, to vary the properties of the silicone composition as desired.

Besides the constituents identified above as being optionally includable in the silicone compositions of the present invention, further optional constituents include antioxidants, flame retardants, and pigments, etc., as well as filler adjuvants, e.g., filler-treating agents such as hydroxy-terminated vinylmethoxysiloxane, for filler treatment of quartz or similar fillers when used in the composition.

In respect of filler components of the silicone compositions of the present invention, it will be appreciated that the use of filler materials may significantly alter the depth of the surface cure of the compositional mass, and fillers may therefore be usefully employed to attain a predetermined desired cured skin thickness on the exterior surface of the compositional mass.

Radiation exposure surface curing of the silicone compositions of the present invention may suitably be carried out in an ambient atmosphere or in an inert atmosphere such as nitrogen or argon atmosphere. Moisture curing of moisture-curable compositions of the present invention is typically suitably carried out in ambient atmospheric exposure conditions, but such curing may alternatively be conducted in an elevated humidity cabinet or other synthetic high humidity environment for the requisite moisture curing period, which may be readily determined within the skill of the art in relation to determination of the product final moisture-cured properties.

The silicone compositions of the present invention utilize components that are easily synthesized within the skill of the art, and/or are readily commercially available.

In making the silicone compositions of the present invention, the silanol-terminated silicone component and the non-mercapto group containing silane cross-linker may be reacted with one another at ambient temperature, e.g., at room temperature in the range of 20° C.–30° C., for sufficient time to complete the reaction, typically 0.5 to 4 hours. Alternatively, elevated temperature may be employed to speed the rate of reaction, however, ambient temperature conditions are generally satisfactory and preferred for ease of synthesis.

The reaction mixture may optionally, if desired, include a suitable catalyst, such as an organometallic compound (e.g., butyllithium) to facilitate the reaction between the silanol-terminated silicone reactant and the non-mercapto group containing silane crosslinker. After the desired extent of reaction, such catalyst may be quenched, for example by addition of acid in the case of organometallic reagents.

After the reaction between the silanol-terminated silicone reactant and the non-mercapto group containing silane crosslinker has been carried out, the silicone fluid reaction product is simply admixed with the photoinitiator for subsequent exposure of the resulting composition to photopolymerizingly effective radiation to surface-cure the composition. The silicone fluid reaction product may thus be admixed with the photoinitiator under non-radiation-exposure conditions, and the resulting mixed composition may be stored in containers which are non-transmissive of photopolymerizingly effective radiation, as a single package composition for subsequent use. Alternatively, the silicone fluid reaction product may be utilized as a two-part or two-package system, in which the silicone fluid reaction product is admixed with the photoinitiator component at the time of use, immediately before application thereof to the locus of use, and surface-curing irradiation of the applied mixed composition.

The surface-curable silicone compositions of the present invention may be variously formulated for suitable use in any variety of applications, including usage as sealants, adhesives, potting compounds, shock or impact damping media, conformal coatings, etc.

In some applications of the present invention, as more fully described hereinafter with reference to Example 7 hereof, it may be desirable to formulate the radiation surface-curable silicone composition so that the radiation surface-cured film of the composition will be transmissive of moisture, but the ethylenically unsaturated functional group endcapped silicone has not hydrolyzable groups so that moisture curing of the underlying non-radiation-cured composition does not take place.

Such compositions may for example be utilized for coating, potting, or other applications, in which it is desired to provide a solid cured silicone film (layer) overlying uncured silicone liquid. In potting applications, for example, such compositional mass, comprising a surface radiation-cured skin capable of retaining the underlying liquid in the potting locus by adhesive bonding of the solid cured silicone skin layer to the bounding surface(s) of the potting locus, can protect the potted element, e.g., an electromechanical mechanism, in the underlying liquid.

The underlying liquid thus subsequently functions as a fluid damping medium which may in fact be superior to solid potting materials in securing the potted element against damage or displacement which might otherwise occur in instances where the potted element assembly is subject to impact, shock, vibration, etc.

FIG. 1 is a partially sectioned side view of an electronic fuel flow sensor assembly, potted with a silicone composition according to one embodiment of the present invention.

The sensor assembly 62 comprises a housing 64 in which is disposed a solenoidal element 66. The solenoidal element is joined by suitable electronic coupling means to female connector elements 71 which permit the sensor assembly to be installed in an automotive electronic system for monitoring fuel flow. The sensor assembly comprises intake port 68 and outlet port 70 providing for fuel flow through the device.

In the housing of the sensor assembly there is an interior space 72 surrounding the solenoidal element 66 and its associated electronic coupling means, to which the potting composition of the invention may be introduced and sequentially cured as previously described. The potting mass comprises an upper radiation-cured skin 102 which is a cured silicone solid layer or film, and which at its periphery is adherently joined (bonded) to the side walls of the housing 64.

By such arrangement, the radiation-cured skin 102 overlies, and encloses (together with the side walls of the housing), the uncured liquid silicone composition 100. If the skin 102 is moisture-permeable in character, but the liquid silicone is not moisture curable as described more fully hereinafter in connection with Example 7 hereof, then the silicone liquid 100 is permanently maintained in liquid state, and constitutes a liquid potting medium for the solenoidal element 66 and associated element structure.

Figure 2:
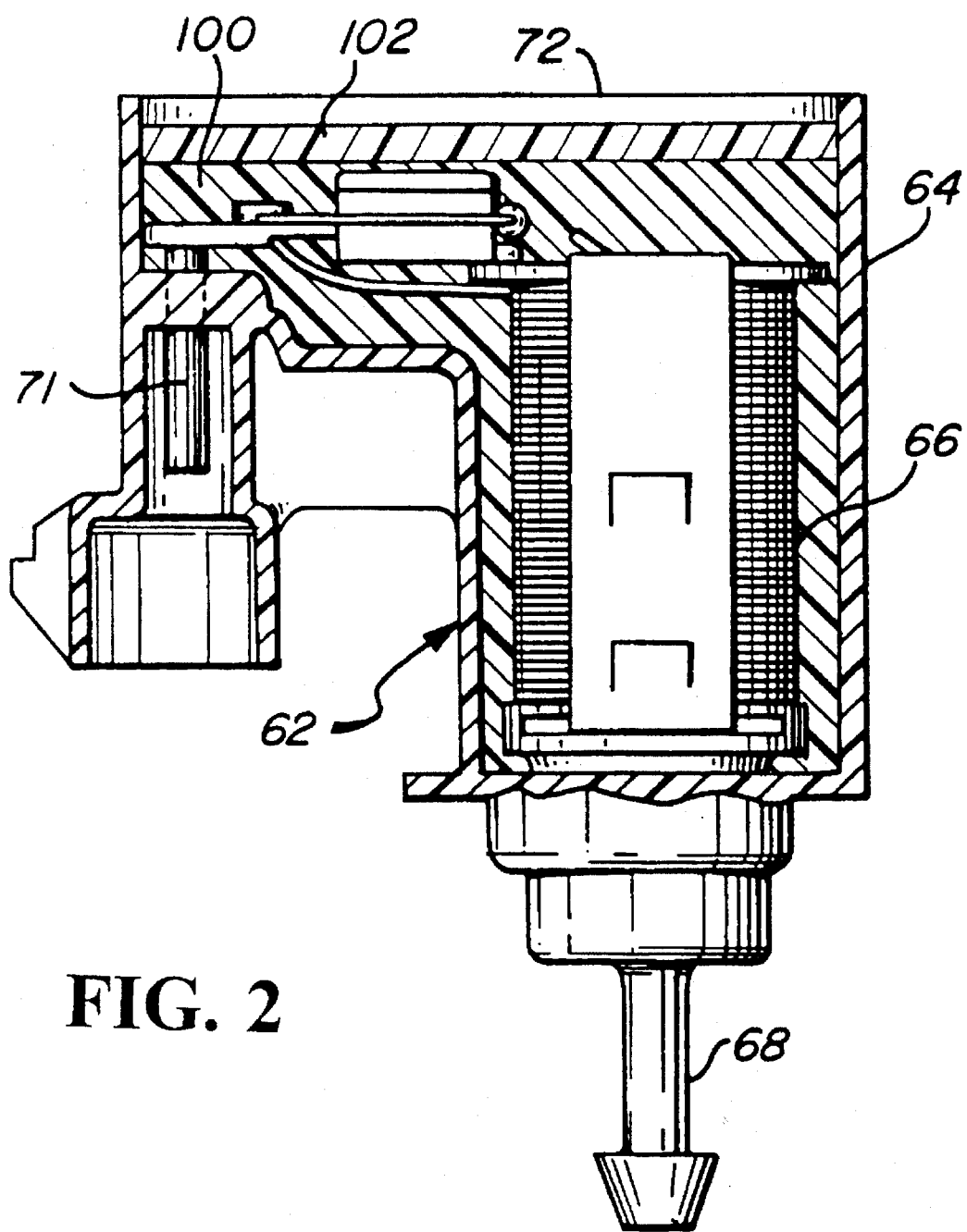
FIG. 2 is a partially sectioned side view of an electronic fuel flow sensor assembly, potted with a silicone composition according to another embodiment of the present invention.

FIG. 2 is a partially sectioned side view of a corresponding electronic fuel flow sensor assembly, potted with a silicone composition according to another embodiment of the present invention. The corresponding parts and elements are numbered in FIG. 2 with the same reference numerals used in FIG. 1. In the FIG. 2 embodiment, the potting composition comprises the radiation-surface-cured skin layer 102 overlying the moisture-cured silicone mass 100 surrounding and encapsulating the solenoidal element 66 and associated element structure. In this FIG. 2 embodiment, the upper layer 100 subsequent to radiation surface-curing formation thereof, remains moisture permeable, so that moisture transmission through the upper skin layer 102 has resulted in moisture-cure of the underlying potting material 100 to a solid state.

In the FIGS. 1 and 2 embodiments, the thickness of the skin layer 102 may be on the order of 10 to 60 mils, depending on the type and character of radiation utilized to effect the cure-formation thereof.

The radiation- and moisture-curable silicone compositions of the present invention thus afford a quick and convenient means for potting an element, in which the initial radiation exposure forms a solid skin layer permitting subsequent moisture-curing of the underlying silicone composition, but which at the same time permits immediate handling, transport and storage of the skin-cured potted article. If such immediate handleability is not required, the entire mass of the composition may be fully moisture-cured, without the expedient of radiation exposure to form the upper skin layer.

The features and advantages of the invention are more fully illustrated in the following non-limiting examples, wherein all parts and percentages are by weight, unless otherwise expressly stated.

EXAMPLE 1

Five hundred ninety-four grams of a silanol-terminated polydimethylsiloxane fluid with an average molecular weight of 18,000 (gel-permeation chromatography) was reacted with 10 g of vinyltrimethoxysilane using a butylithium catalyst for 2 hours. The catalyst was then quenched with acid. The material thus obtained is a vinyldimethoxy-terminated silicone fluid.

To 20 g of the above fluid was added 0.30 g of diethoxy-acetophenone and 0.10 g of titanium tetraisopropoxide and the resulting composition (denoted hereinafter as "Base Composition") was thoroughly mixed. The Base Composition mixture was separated into 2 equal fractions and poured into aluminum dishes. One of these fractions, denoted here as Sample A, was subjected to uv irradiation using a Fusion System ultraviolet light source with a light intensity of ~75 milliwatts per square centimeter (mw/cm$^2$) for one minute. The irradiated material formed a firm non-tacky surface skin having a pale yellowish tint, and with uncured liquid enclosed underneath the skin. Attempted determination of the hardness of the material using a Durometer (00) gauge failed to register a reading (hardness 0). However, the skin film was firm enough so that the needle of the durometer gauge will not penetrate (rupture) the film. Inversion of the aluminum dish did not cause the liquid enclosed by the film to leak through it or rupture the film.

The other of the fractions, denoted here as Sample B, was not surface radiation-cured or otherwise exposed to curingly effective radiation.

Both of the samples then were moisture-cured overnight and Durometer (00) readings were taken the following day for each. The Durometer (00) value measured for Sample A was 70 and the Durometer (00) value measured for Sample B was 67.

As a comparison, the Base Composition was modified with only 1.5% diethoxyacetophenone being added and without any titanium tetraisopropoxide therein (hereinafter denoted "Modified Composition A"). Modified Composition A was uv-curable (using the same irradiation system as described above) to yield a firm layer of non-tacky skin with liquid enclosed therein. The enclosed liquid, however, would not moisture cure. Inversion of the aluminum dish did not cause the liquid to leak through the skin.

As a further comparison, a mixture of 594 g of the above silanol terminated fluid and 10 g of the vinyltrimethoxysilane was made. Twenty grams of this mixture was formulated with 0.30 g of diethoxyacetophenone. The formulated mixture (hereinafter denoted "Modified Composition B") was subjected to the same uv irradiation system as above described and only a very thin layer of tacky skin was obtained. Inversion of the aluminum dish caused the liquid underneath the skin to leak through the thin skin. The skin was also readily removed by finger touch.

As still a further comparison, 370.4 g of the same silanol fluid was reacted with 5.6 g methyltrimethoxysilane using butylithium catalyst for 2 hours. The catalyst was then quenched by acid. The material thus obtained was a methyldimethoxy terminated silicone fluid. To 20 g of this fluid was further added 0.30 g of diethoxyacetophenone. The resulting mixture (hereinafter denoted "Modified Composition C") was subjected to the same uv irradiation system as described above. Only a very thin surface layer of film was formed. Inverting the container of the mixture after uv curing caused the enclosed liquid to flow through the thin film immediately. The film itself was so weak that lightly touching the film caused the film to be lifted from the liquid.

EXAMPLE 2

Twenty grams of the silanol terminated fluid with an average molecular weight of 18,000 was mixed with 0.72 g of vinyltrioximinosilane [$CH_2$=CHSi(ON=CMeEt)$_3$]. The mixture was further formulated with 0.30 g of diethoxyacetophenone and 0.10 g of dimethyl tin bis(neodecanoate).

The mixture was separated into two equal fractions, denoted hereinafter as "Sample C" and "Sample D," respectively. Sample C was subjected to uv cure as described in Example 1 whereas Sample D was moisture cured. The uv cured Sample C was an initial pale yellowish gel with a firm, non-tacky surface probably with fluid underlying the gel. The film was firm enough so that when the aluminum dish was inverted, no enclosed liquid leaked through the film. The hardness of the surface-cured Sample C material was found to be Durometer (00) of zero. Both Sample C and Sample D were exposed to atmospheric relative humidity conditions to complete the moisture cure. Both Sample C and Sample D showed Durometer (00) readings of 62 after final moisture cure.

As a comparison, vinyltrioximinosilane was replaced by methyltrioximinosilane in the above-described formulation procedure and the resulting composition (Sample E) when irradiated by the same uv curing procedure as Sample C yielded a material with a very thin, tacky skin which was readily lifted away upon lightly touching the surface with fingers. When the dish was attempted to be inverted, the uncured liquid beneath the skin immediately flowed through the film.

EXAMPLE 3

Twenty grams of the silanol terminated fluid with an average molecular weight of 18,000 was mixed with 0.72 g of vinyltrioximinosilane. To this mixture was further and sequentially added 0.80 g ethyltriacetoxysilane, 0.30 g diethoxyacetophenone, and 0.10 g dimethyl tin bis(neodecanoate). The formulation was separated into two equal fractions, denoted hereinafter as Sample F and Sample G, respectively. Sample F was subjected to uv curing by the same irradiation procedure as described above for Sample C. The mixture formed a firm, non-tacky skin film layer upon uv cure. No. liquid leaked through the film when the aluminum dish containing the surface-cured material was inverted. Both Sample F and Sample G then were moisture-cured for 72 hours, following which Durometer (00) values were determined. Each of the Samples F and G yielded Durometer (00) readings of 60.

As a comparison, the order of addition of vinyltrioximinosilane and ethyltriacetoxysilane was reversed in the above process, and the resulting material (Sample H) upon uv cure (by the same irradiation procedure as Sample C) formed a very thin tacky film which was readily lifted by the touch of a finger. Inverting the aluminum dish containing this surface-cured material caused an immediate flow of the liquid through the film. This formulation then was moisture-cured for 72 hours, yielding a cured silicone material having a Durometer (00) hardness value of 60.

EXAMPLE 4

Vinyltriacetoxysilane (0.47 g) was added to 20.74 g of silanol terminated silicone fluid with an average molecular weight of 20,000. To this mixture was further added 0.30 g of diethoxyacetophenone and 0.10 g dimethyl tin bis(neo-decanoate). The formulation was thoroughly mixed and deaerated. The resulting mixture then was separated into two equal fractions, denoted hereinafter as Sample I and Sample J. Sample I was uv cured by the same irradiation procedure as described above for Sample C to yield a surface-cured silicone material having a firm non-tacky skin which was strong enough to hold the uncured liquid beneath the skin when the aluminum dish was inverted. Both Sample I and Sample J then were moisture-cured overnight to form a cured silicone rubber product. Both cured materials (Sample I and Sample J) had the same Durometer (00) hardness value of 73.

EXAMPLE 5

Silanol-terminated polydimethylsiloxane fluids with an average molecular weight of 20,000 were partially end-capped with trimethylchlorosilane and hexamethyldisilazane. The resulting fluids were filtered and further end-capped with vinyltrioximinosilane. The fluids upon addition of 1.5% diethoxyacetophenone and 0.5% dimethyl tin bis-(neodecanoate) were found to be uv-surface-curable (by the same irradiation method described for Sample C) to yield an irradiated silicone material having a non-tacky skin. These formulations were also determined to be moisture-curable to form silicone rubbers. The hardness of the fully cured product rubbers was found to be correlated to the levels of trimethylsilyl endgroups. Specifically, the higher the trimethylsilyl level in the formulation, the softer the cured product rubber. The hardness of the cured product rubber samples was found to be unrelated to the mode of cure. Thus, both (uv/moisture) dual cure silicone rubber products and moisture-only cure silicone rubber products exhibited similar hardness levels as shown in Table I below:

EXAMPLE 6

The silicone composition formulation procedure of Example 5 was repeated using the following photoinitiators in place of diethoxyacetophenone: Darocur 1116 (($CH_3$)$_2$CHC$_6$H$_4$C=OC($CH_3$)$_2$OH), 1173 (2-hydroxy-2-methyl-1-phenylpropane-1-one), 1664 (proprietary, E.M. Industries) and 2273 (proprietary, E.M. Industries). In all cases the irradiation of the applied compositions on the substrate (aluminum pan) by the irradiation procedure of Example 1 yielded radiation-surface-cured materials having firm non-tacky surface layer films with characteristics similar to those obtained using the photoinitiators of Example 5.

EXAMPLE 7

A vinyl terminated silicone polymer having a weight average molecular weight of 93,000 was formulated with 1.5% diethoxyacetophenone. The resulting silicone material upon uv irradiation formed a gel with liquid underneath the surface skin layer. This material however would not moisture cure.

This composition illustrates an embodiment of the invention that may be useful in instances where formation of a strong and physically continuous film on top of a fluid is desired to prevent the underlying (uncured) fluid from migrating.

The silicone composition of this Example may thus be usefully employed as a potting material, in which the silicone composition is dispensed into a housing containing a mechanism, structural element, or other material(s) for encapsulation thereof, and subsequent to dispensing, the composition is irradiated with surface-curingly-effective radiation to form a firm, fixedly positioned and stable skin layer on the upper surface of the potting mass, below which, contained by the bounding surfaces of the housing, is the uncured liquid silicone composition.

The underlying liquid, as a result of its confinement by the surface-cured skin and bounding cavity surfaces to which the skin is adherently bonded, thereafter functions as a fluidic encapsulation and shock damping system, which as a result of its viscous damping character, is markedly superior to solid (fully cured resin) potting compositions of the prior art, in respect of protecting the encapsulated structure or material from damage or displacement as a result of shocks, vibration, impact, etc. exerted on the encapsulation (potting) system.

Further, the "liquid potting" formulation is not subject to differential thermal expansion effects which adversely affect solid potting masses, causing cracking and stress fractures and associated tensile, compressive, and torsional forces on the mechanisms or elements being encapsulated by the potting medium.

TABLE I

HARDNESS VALUES FOR SAMPLES SEQUENTIALLY CURED BY INITIAL UV EXPOSURE
FOLLOWED BY MOISTURE CURE (DUAL CURE), VERSUS SAMPLES FULLY CURED
ONLY BY MOISTURE CURE (MONOCURE)

| Curing Modality | 0% Me$_5$Si-<br>100% visi(Oxima)$_3$ | 25% Me$_5$Si-<br>75% visi(Oxima)$_3$ | 40% Me$_5$Si-<br>50% visi(Oxima)$_3$ | 50% Me$_5$Si-<br>50%visi(Oxima)$_3$ | 60% Me$_5$Si-<br>40% Visi(Oxima)$_3$ |
|---|---|---|---|---|---|
| Dual cure | 71 | 69 | 43 | 22 | gum |
| Monocure | 72 | 69 | 41 | 23 | gum |

For these reasons, the liquid potting structure of the present invention, comprising a surface radiation-cured skin and an underlying uncured liquid, in a cavity or other containment locus, is a marked advance in the art of potting and encapsulation.

EXAMPLE 8

Forty grams of 100 cps (Brooksfield viscometer) silanol-terminated polydimethylsiloxane fluid with a number average molecular weight of 5,000 (nuclear magnetic resonance) was mixed (encapped) with 5.00 g of vinyltris(methylketoximino)silane. The initially cloudy mixture became clear in a matter of seconds when encapping was complete. To the mixture was further added 0.675 g of diethoxyacetophenone.

To an aluminum dish with a diameter of 65 mm was added 0.5 g of the above formulation. The material was allowed to spread to cover the whole dish. The thickness of the coating coverage was approximately 6 mils. UV irradiation of the coating using a Fusion System (medium pressure mercury lamp) at a radiation flux of $\cong 75$ milliwatts/cm² for one minute resulted in a soft cured silicone coating that was dry to the touch. The coating will further moisture cure to give a hard silicone coating.

In contrast, when methyltris(methylethylketoximino)-silane was used in place of vinyltris(methylethylketoximino)-silane in the above formulation, the resulting material showed no uv curing capability under identical curing conditions. The material remained liquid after attempted uv curing. The material did moisture cure to a silicone coating after a few hours standing.

While the invention has been illustratively described herein with reference to various preferred features, aspects and embodiments, it will be appreciated that the invention is not thus limited, and may be widely varied in respect of alternative variations, modifications, and other embodiments, and therefore the invention is to be broadly construed as including such alternative variations, modifications and other embodiments, within the spirit and scope of the invention as claimed.

What is claimed is:

1. A liquid-phase radiation surface-curable RTV silicone composition which in exposure to radiation forms a solid skin layer overlying uncured liquid of said composition, and which subsequent to radiation surface curing thereof, is interiorly moisture-curable in character in said uncured liquid overlaid by said solid skin layer formed by said exposure to radiation, said radiation surface-curable, subsequently interiorly moisture-curable RTV silicone composition comprising:

an unsaturated functional group endcapped silicone wherein said endcapped silicone is formed by reacting a silanol-terminated silicone with a non-mercapto-group containing silane cross-linker for the silicone, such cross-linker having the formula:

$R_a SiX_b$ wherein:

R is selected from the group consisting of monovalent ethylenically unsaturated radicals selected from the group consisting of vinyl, propenyl, butenyl, pentenyl, hexenyl, octenyl, allyl, alkenyloxy, alkenylamino, allyloxy, and allylamino; $C_1$–$C_8$ alkyl, $C_6$–$C_{12}$ aryl, $C_7$–$C_{18}$ arylalkyl, $C_7$–$C_{18}$ alkylaryl, and X;

X is a monovalent functionality imparting moisture-curability to the functional group endcapped silicone;

a has a value of 1 or 2;

b has a value of 2 or 3; and a+b=4;

with the proviso that when a is 1, R is a monovalent ethylenically unsaturated radical, and that when a is 2, at least one R is a monovalent ethylenically unsaturated radical;

and said endcapped silicone has a number average molecular weight of at least about 5000 as determined by nuclear magnetic resonance; and a photoinitiator effective for radiation surface curing of the silicone composition.

2. A composition according to claim 1, wherein the endcapped silicone has a number average molecular weight of at least about 10,000.

3. A composition according to claim 1, wherein the silanol-terminated silicone comprises a linear polydiorganosiloxane having a weight average molecular weight of from about 5,000 to about 300,000 as determined by gel-permeation chromatography.

4. A composition according to claim 1, wherein the silanol-terminated silicone is predominantly linear in character, having the silanol (—SiOH) functionality located at the terminus of a polysiloxy (—(SiO)$_x$—) moiety in the silicone molecule.

5. A composition according to claim 1, wherein the silanol-terminated silicone is a linear molecule both of whose terminal functional groups comprise hydroxy groups.

6. A composition according to claim 1, wherein the silanol-terminated silicone is an organopolysiloxane whose organo substituents are predominantly methyl.

7. A composition according to claim 1, wherein the monovalent ethylenically unsaturated radical is selected from the group consisting of vinyl and allyl groups.

8. A composition according to claim 1, wherein the monovalent ethylenically unsaturated radical is vinyl.

9. A composition according to claim 1, wherein the silane cross-linker is selected from the group consisting of vinyltrimethoxysilane, vinyltriaminosilane, vinyltriamidosilane, vinyltrioximinosilane, vinyltriosopropenoxysilane, and vinyltriacetoxysilane.

10. A composition according to claim 1, wherein the photoinitiator is selected from the group consisting of benzoin, benzophenone, Michler's ketone, dialkoxy-acetophenones, acetophenone, benzil, and derivatives and mixtures thereof.

11. A composition according to claim 1, wherein the photoinitiator is diethoxyacetophenone.

12. A composition according to claim 1, wherein the photoinitiator has a concentration of from about 0.1% to about 10% by weight, based on the weight of the silanol-terminated silicone.

13. A potting material for dispensing to an encapsulation locus including a bounding surface delimiting a volume in which an encapsulation structure is disposable for potting in a liquid medium overlaid by an enclosure layer adhesively bonded to the bounding surface, said potting material comprising:

an unsaturated functional group endcapped silicone comprising a liquid-phase radiation surface-curable RTV silicone composition which in exposure to radiation forms a solid skin layer overlying uncured liquid of said composition, and which subsequent to radiation surface curing thereof, is interiorly moisture-curable in character in said uncured liquid overlaid by said solid skin layer formed by said exposure to radiation, wherein said endcapped silicone is formed by reacting a silanol-terminated silicone with a non-mercapto-group containing silane cross-linker for the silicone, such cross-linker having the formula:

$$R_a SiX_b$$

wherein:
R is selected from the group consisting of monovalent ethylenically unsaturated radicals selected from the group consisting of vinyl, propenyl, butenyl, pentenyl, hexenyl, octenyl, allyl, alkenyloxy, alkenylamino, allyloxy, and allylamino; $C_1$–$C_8$ alkyl, $C_6$–$C_{12}$ aryl, $C_7$–$C_{18}$ arylalkyl, $C_7$–$C_{18}$ alkylaryl, and X;

X is a monovalent functionality imparting moisture-curability to the functional group endcapped silicone;

a has a value of 1 or 2;
b has a value of 2 or 3; and
a+b=4;

with the proviso that when a is 1, R is a monovalent ethylenically unsaturated radical, and that when a is 2, at least one R is a monovalent ethylenically unsaturated radical;

and said endcapped silicone has a number average molecular weight of at least about 5000 as determined by nuclear magnetic resonance; and a photoinitiator effective for radiation surface curing of the silicone composition;

wherein the potting material is surface-curable by irradiation of the material to form said overlying enclosure layer and wherein subsequent to formation thereof the potting material underlying the enclosure layer is moisture-curable.

* * * * *

UNITED STATES PATENT AND TRADEMARK OFFICE
CERTIFICATE OF CORRECTION

PATENT NO. : 5,498,642
DATED : March 12, 1996
INVENTOR(S) : "RADIATION SURFACE-CURABLE, ROOM TEMPERATURE VULCANIZING SILICONE COMPOSITIONS"

It is certified that error appears in the above-indentified patent and that said Letters Patent is hereby corrected as shown below:

Column 1, line 20, change "coating" to -- coatings --.
Column 1, line 22, change "endcapping, α," to --endcapping α,--.
Column 5, line 12, change "exposer" to --exposure--.

Column 10, line 35, change "gourd" to --ground--.

Signed and Sealed this

Fifteenth Day of October, 1996

Attest:

BRUCE LEHMAN

*Attesting Officer*     *Commissioner of Patents and Trademarks*